United States Patent [19]

Williams, Jr.

[11] 3,750,039

[45] July 31, 1973

[54] CURRENT STEERING AMPLIFIER

[75] Inventor: Roy M. Williams, Jr., Nashua, N.H.

[73] Assignee: Sanders Associates, Inc., Nashua, N.H.

[22] Filed: Mar. 27, 1969

[21] Appl. No.: 811,093

[52] U.S. Cl. .................... 330/13, 330/24, 330/30 R

[51] Int. Cl. .................... H03f 3/04

[58] Field of Search .................... 330/13, 24, 207 P, 330/18, 30 D, 69

[56] References Cited

UNITED STATES PATENTS

| | | | |
|---|---|---|---|
| 3,328,599 | 6/1967 | Stupar | 307/235 |
| 3,375,455 | 3/1968 | Motta | 330/13 |
| 3,471,795 | 10/1969 | Schilling | 330/24 |
| 3,501,712 | 3/1970 | Webb | 330/30 |

*Primary Examiner*—Nathan Kaufman
*Attorney*—Louis Etlinger

[57] ABSTRACT

The output circuit, or load, is connected to draw current from either one of two constant current sources of opposite polarity. A pair of auxiliary circuits have their conductivity differentially controlled by the input signal. These circuits are connected so that as one steers current from one source away from the load and through itself, the other steers current from the other source away from itself and into the load.

11 Claims, 1 Drawing Figure

PATENTED JUL 31 1973
3.750.039
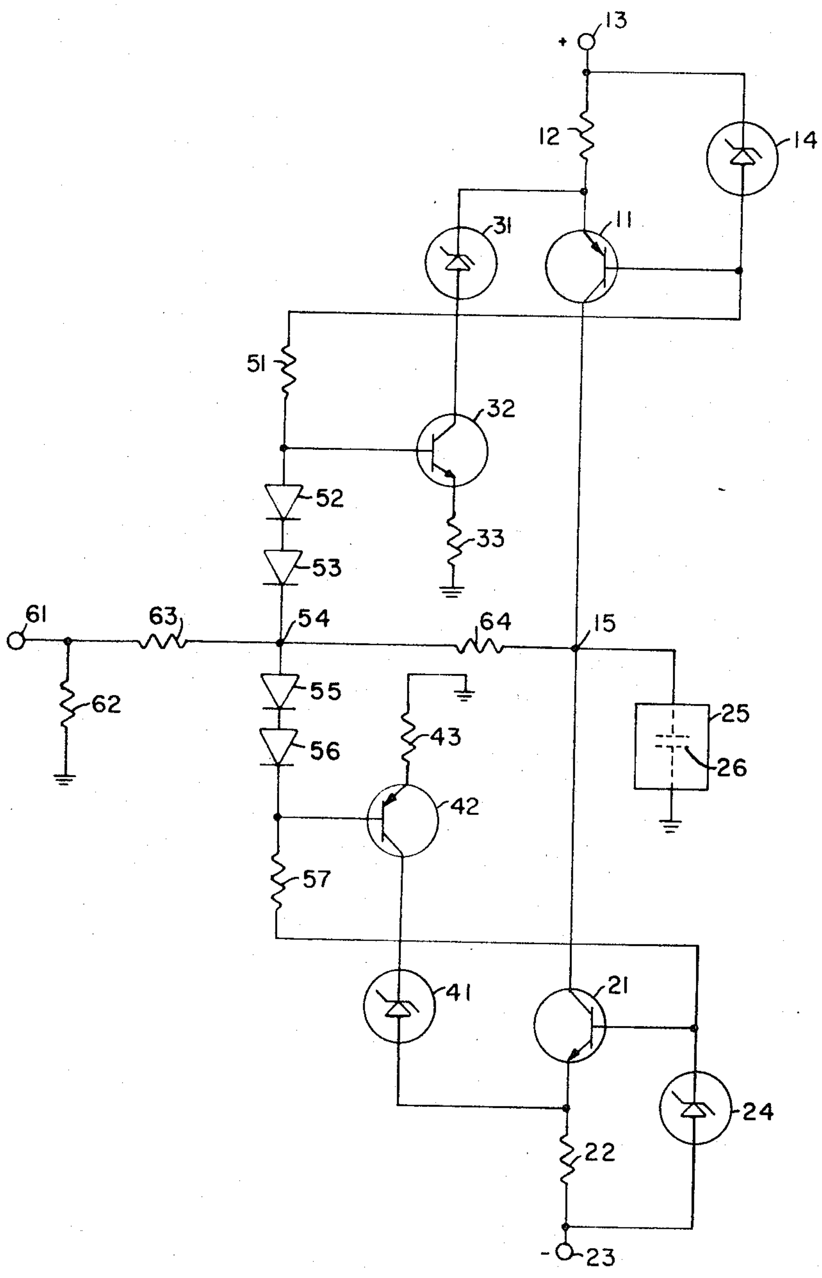
INVENTOR.
ROY M. WILLIAMS JR.
BY
W L [signature]
ATTORNEY

CURRENT STEERING AMPLIFIER

FIELD OF THE INVENTION

This invention relates generally to electronic amplifiers and particularly to a wide band amplifier capable of impressing voltage waveforms having fast rise and fall times across a capacitive load.

BACKGROUND OF THE INVENTION

There are many uses for an amplifier which can pass a wide band of frequencies and operate successfully with capacitive loads. One example is a video amplifier working into the grid of a cathode ray tube. Another example is a deflection amplifier for an oscilloscope. In both cases, voltage waveforms with fast rise and fall times must be impressed across capacitive loads. In designing such an amplifier, one naturally thinks of using a transistor output stage with a low value of load resistor so as to decrease the time constant. But a small load resistor requires a large current which in turn requires a high power transistor. Such a transistor will probably have considerable inherent capacitance of its own thus compounding the problems. These problems are not insuperable but they do make the design difficult and require the use of high power transistors.

It is a general object of the present invention to provide an improved wide band amplifier.

It is another object to provide a wide band amplifier suitable for use with capacitive loads.

It is another object to provide a wide band amplifier using transistors with but low power dissipating capabilities.

SUMMARY OF THE INVENTION

Briefly stated, an amplifier incorporating the present invention includes a network in which current from a constant current source is divided between a load circuit and a power dissipating circuit in substantially any desired proportion as dictated by an input signal. Preferably two such networks with complementary sources are provided so that current may be passed through a load in either direction.

BRIEF DESCRIPTION OF THE DRAWING

For a clearer understanding of the invention, reference may be made to the following detailed description and the accompanying drawing, the single FIGURE of which is a schematic diagram of a preferred embodiment of the invention.

BRIEF DESCRIPTION OF PREFERRED EMBODIMENT

Referring now to the drawing, a PNP transistor 11 has its emitter connected through a resistor 12 to a positive voltage source 13. A constant voltage element 14 is connected between the source 13 and the base of the transistor 11. The element 14 is a device which exhibits a substantially constant voltage drop across its terminals over a wide range of currents through it. The element 14 may, for example, be a gas filled tube but preferably is a Zener diode as shown, with its anode connected to the base and its cathode connected to the source 13. The collector of the transistor 11 is connected to a common junction 15.

An NPN transistor 21, whose characteristics are similar but complementary to those of the transistor 11, has its emitter connected through a resistor 22 to a negative voltage source 23. A constant voltage element 24 is connected between the base of the transistor 21 and the source 23 and is preferably a Zener diode having its cathode connected to the base and its anode connected to the source 23. The collector of the transistor 21 is also connected to the common junction 15. A load 25, illustrated as having an inherent capacitance 26, is connected between the common junction 15 and ground.

An auxiliary circuit is connected to the emitter of the transistor 11 and includes a constant voltage device such as the Zener diode 31 having its cathode connected to the emitter of transistor 11 and its anode connected to the collector of an NPN transistor 32. The emitter of this transistor is connected through a resistor 33 to ground. Similarly, another auxiliary circuit includes a Zener diode 41 having its anode connected to the emitter of the transistor 21 and its cathode connected to the collector of a PNP transistor 42, the emitter of which is connected through a resistor 43 to ground. The transistor 42 has characteristics similar but complementary to those of the transistor 32.

Bias for the bases of transistors 32 and 42 is provided by a circuit extending from the anode of the Zener diode 14 through a resistor 51, the anode-cathode circuits of two serially connected diodes 52 and 53, a junction 54, the anode-cathode circuits of two serially connected diodes 55 and 56, and a resistor 57 to the cathode of the Zener diode 24. The base of the transistor 32 is connected to the junction of the resistor 51 and the diode 52 while the base of the transistor 42 is connected to the junction of the diode 56 and the resistor 57. The resistors 51 and 57, instead of being connected to the Zener diodes 14 and 24, could have been connected to separate Zener diodes which in turn could have been connected to the sources 13 and 23. This in turn would have required additional resistors from the Zener diodes 14 and 24 to ground and accordingly the connection shown, which requires fewer components, is preferred at present.

A terminal 61 to which the input signal is applied is connected through a resistor 62 to ground and is also connected through a resistor 63 to the junction 54. A feedback resistor 64 is connected from the common junction 15 to the junction 54.

OPERATION

The Zener diode 14 establishes a substantially constant potential difference between the base of the transistor 11 and the source 13 and accordingly, as is well understood, a substantially constant current flows through the resistor 12. Similarly, a substantially constant current flows through the resistor 22. In the absence of the auxiliary circuits, those containing transistors 32 and 42, the entire amount of each of these currents would flow through the transistors 11 and 21. If the currents through resistors 12 and 22 were equal, the potential of the junction 15 would be substantially ground and no current would flow through the load 25. The auxiliary circuits provide additional paths through which some of the current of the resistors 12 and 22 can be directed, or steered. It is apparent that the division of current between the transistor 11 and the transistor 32 can be controlled by controlling the conductivity of the transistor 32. Similar comments apply to transistors 21 and 42.

The various circuit parameters are selected so that with zero input signal, a small, or trickle, current flows through the transistors 11 and 21. These currents are equal so that the common junction 15 is at ground potential. The majority of the current flows through the auxiliary circuits including the transistors 32 and 42 and the Zener diodes 31 and 41. These circuits are designed so that most of the voltage drop appears across the Zener diodes 31 and 41 and these elements act as power dissipating devices. While shown as single elements, it is apparent that more than one could be used in each circuit. The transistors 32 and 42, although passing large currents, are low voltage types and do not dissipate much power.

Let it be assumed that a negative going voltage with a fast fall time is applied to the terminal 61. The voltage drop across resistor 62 is transferred through the resistor 63 to the junction 54. Initially there is no feedback and therefore this voltage is applied to the bases of the transistors 32 and 42. This renders transistor 32 less conductive, thereby steering more of the current flowing through resistor 12 into the transistor 11. At the same time, the transistor 42 becomes more conductive, thus steering more of the current flowing through resistor 22 away from the transistor 21. As a result, a large current flows through the transistor 11 into the load 25. Any capacitance in the load is quickly charged and accordingly the voltage across the load rises quickly. This voltage, which appears at the junction 15, is combined with the input voltage on terminal 61 through summing resistors 63 and 64. Their sum appears at the junction, or summing point, 54 and constitutes an error signal which controls further operation of the amplifier. A point of equilibrium is soon reached with the voltage across the load being that dictated by the input signal.

It is apparent that a positive input signal would have a similar but opposite effect with a large current flowing from ground through the load 25, junction 15, and transistor 21 to the resistor 22 and thence to the power supply 23, with only a small current flowing through the transistor 42.

It is to be noted that the transistors 11 and 21 conduct heavily only during fast rise and fall times respectively of the voltage across the load. At all other times, each carries but little current. Accordingly, these transistors need not be capable of dissipating large amounts of power.

It is also to be recalled that, as previously mentioned, the transistors 32 and 42 also dissipate but small amounts of power. Although they carry large currents, the voltage drop is small because most of the drop occurs across the power dissipating Zener diodes 31 and 41.

From the foregoing it will be apparent that Applicant has provided an improved wide band amplifier capable of driving a capacitive load and using only transistors with low power ratings.

Although a specific embodiment of the invention has been described in considerable detail for illustrative purposes, many modifications within the spirit of the invention will occur to those skilled in the art. It is therefore desired that the protection afforded by Letters Patent be limited only by the true scope of the appended claims.

I claim:

1. A wide band amplifier, comprising a first transistor including a base, a collector and an emitter, a resistor connected between a source of unidirectional voltage and said emitter, a first constant voltage element connected to maintain a substantially constant potential difference between said source and said base, a load device having a first terminal connected to said collector and a second terminal connected to ground, a second transistor including a base, a collector and an emitter, said emitter being returned to ground, a second constant voltage element connected between said emitter of said first transistor and said collector of said second transistor, means for applying a forward bias to said base of said second transistor, an input terminal for receiving an input signal, and circuit means interconnecting said input terminal and said base of said second transistor, whereby variations in said input signal cause variation in the conductivity of said second transistor and variations in the voltage across said load device.

2. A wide band amplifier in accordance with claim 1 including a negative feedback path interconnecting said load device and said circuit means.

3. A wide band amplifier, comprising, first and second transistors of complementary symmetrical types having their collectors connected to a common junction and their emitters connected through their individual resistors to sources of unidirectional voltage of opposite polarity, first and second constant voltage elements connected to maintain the bases of said transistors at substantially constant potentials relative to their respective associated sources, a load connected between said common junction and ground, first and second conductive paths connected between said emitters of said first and second transistors respectively and ground and including third and fourth constant voltage elements respectively connected in series with the collector-emitter circuits of third and fourth transistors respectively of complementary symmetrical types comparable to the types of said second and first transistors respectively, circuit means for applying an input signal to the bases of said third and fourth transistors so that as one is rendered more conductive the other is rendered less conductive and a negative feedback path from said common junction to said circuit means, whereby an input signal having a fast rise time causes a large current to flow through one of said first and second transistors to said load only during said rise time so that the potential across said load closely follows that of said input signal.

4. A wide band amplifier, comprising a transistor including a base, a collector and an emitter, a resistor connected between a source of unidirectional voltage and said emitter, a constant voltage element connected to maintain a substantially constant potential difference between said source and said base, a load device having a first terminal connected to said collector and a second terminal connected to ground, a conductive path interconnecting said emitter and ground, and means responsive to an input signal for varying the conductivity of said conductive path, whereby the current through said load device is varied.

5. A wide band amplifier in accordance with claim 4, in which said conductive path includes a transistor and which includes means responsive to said input signal for varying the conductivity of said transistor.

6. A wide band amplifier in accordance with claim 5 in which said conductive path includes a constant voltage power dissipating element.

7. A wide band amplifier in accordance with claim 5 which includes means for comparing the voltage across said load device with the voltage of said input signal and means responsive to the algebraic sum of said voltages for controlling the conductivity of said transistor.

8. A wide band amplifier comprising first and second transistors of complementary symmetrical types having their collectors connected to a common junction and their emitters connected through their individual resistors to sources of unidirectional voltage of opposite polarity.

first and second constant voltage elements connected to maintain the bases of said transistors at substantially constant potentials relative to their respective associated sources, a load device connected between said common junction and ground, first and second conductive paths interconnecting said emitters of said first and second transistors respectively and ground, and means responsive to an input signal for varying the conductivity of said paths simultaneously in opposite senses, whereby the current through said load device is varied.

9. A wide band amplifier in accordance with claim 8 in which said first and second conductive paths include third and fourth transistors respectively of complementary symmetrical types, and in which said means responsive includes means for varying the conductivity of said third and fourth transistors simultaneously in opposite senses.

10. A wide band amplifier in accordance with claim 9 in which said first and fourth transistors are of the same type and in which said second and third transistors are of the same type.

11. A wide band amplifier in accordance with claim 10 in which each of said conductive paths includes a constant voltage power dissipating element.

* * * * *